United States Patent
Tsai et al.

(10) Patent No.: US 9,570,301 B2
(45) Date of Patent: Feb. 14, 2017

(54) PROJECTION PATTERNING WITH EXPOSURE MASK

(71) Applicants: National Taiwan University, Taipei (TW); Taiwan Semiconductor Manufacturing Company, Ltd., Hsin-Chu (TW)

(72) Inventors: Kuen-Yu Tsai, Taipei (TW); Miin-Jang Chen, Taipei (TW); Si-Chen Lee, Taipei (TW)

(73) Assignees: Taiwan Semiconductor Manufacturing Company, Ltd., Hsin-Chu (TW); National Taiwan University, Taipei (TW)

( * ) Notice: Subject to any disclaimer, the term of this patent is extended or adjusted under 35 U.S.C. 154(b) by 0 days.

(21) Appl. No.: 14/290,742

(22) Filed: May 29, 2014

(65) Prior Publication Data

US 2015/0348775 A1 Dec. 3, 2015

(51) Int. Cl.
*H01L 21/00* (2006.01)
*H01L 21/027* (2006.01)
*H01L 21/033* (2006.01)
*G03F 7/20* (2006.01)

(52) U.S. Cl.
CPC ......... *H01L 21/0274* (2013.01); *G03F 7/2039* (2013.01); *G03F 7/2045* (2013.01); *H01L 21/0278* (2013.01); *H01L 21/0279* (2013.01); *H01L 21/0337* (2013.01)

(58) Field of Classification Search
CPC ...... G03F 1/20; G03F 7/2037; H01L 21/0274; H01L 21/0278; H01L 21/0279; H01L 21/0337

See application file for complete search history.

(56) References Cited

U.S. PATENT DOCUMENTS

| | | | |
|---|---|---|---|
| 8,216,948 B2 * | 7/2012 | Moon | G03F 1/144 438/714 |
| 8,932,955 B1 * | 1/2015 | Sel et al. | 438/694 |
| 2009/0286185 A1 * | 11/2009 | Bae | H01L 21/0273 430/312 |

OTHER PUBLICATIONS

Frank Barkusky et al., "Direct photo-etching of poly•methyl methacrylate using focused extreme ultraviolet radiation from a table-top laser-induced plasma source," Journal of Appled Physics 101 (2007), 6 pages.
Hou-Yu Chen, et al., "A Novel Nanoinjection Lithography (NInL) Technology and Its Application for 16-nm Node Device Fabrication," IEEE Transactions on Electron Devices, vol. 58, No. 11, Nov. 2011, pp. 3678-3686 (9 pages).
Qing Ma et al., "X-ray induced, substrate-carrier mediated deposition of metal on GaAs," Applied Physics Letters 89 (2006); 4 pages.
(Continued)

*Primary Examiner* — Richard Booth
(74) *Attorney, Agent, or Firm* — Slater Matsil, LLP

(57) ABSTRACT

A process for fabricating an integrated circuit is provided. The process includes providing a substrate and forming a hard mask on the substrate. The hard mask may be formed by atomic-layer deposition (ALD) or molecular-layer deposition (MLD). The process also includes disposing an exposure mask over the hard mask and exposing the exposure mask to a patterning particle to pattern a gap in the hard mask. The patterning particle may be, for example, a photon or a charged particle.

20 Claims, 7 Drawing Sheets

(56) References Cited

OTHER PUBLICATIONS

U. Streller et al., "Photon-induced dry etching of Si(lOO) in the VUV," Applied Surface Science 96-98 (1996), pp. 448-452 (5 pages).
Yugang Sun et al., "Effects of visible and synchrotron x-ray radiation on the growth of silver nanoplates on n-Ga As wafers: A comparative study," Applied Physics Letters 92, 2008, 4 pages.
Dorp et al., "A critical literature review of focused electron beam induced deposition", Journal of Applied Physics 104, 081301, 2008.
Emile van der Drift et al., "Helium Ion Lithography Principles and Performance", in Nanofabrication Techniques and Principles, 2012 Springer-Verlag, Chapter 4, pp. 93-116.
Hollenbeck, "Oxide thin films for nanometer scale electron beam lithography",J. Mater. Res., vol. 5, No. 5, May 5, 1990, pp. 1058-1072.

\* cited by examiner

PROJECTION PATTERNING WITH EXPOSURE MASK

BACKGROUND

Charged-particle lithography, such as ion- or electron-projection lithography, is capable of very-high-resolution patterning. Ion beam lithography uses a focused or broad beam of energetic lightweight ions for transferring pattern to a surface. Using Ion Beam Lithography (IBL) nano-scale features can be transferred on non-planar surfaces.

In charged-particle (e.g., electron, and ions such as helium, $He^+$, neon, $Ne^+$, and gallium, $Ga^+$) or photon (e.g., deep ultraviolet, DUV, extreme ultraviolet, EUV, X-ray) lithography, the fundamental process mechanism involves using bond dissociation in positive resist or bond association in negative resist and resultant dissolution rate differences between the exposed and unexposed areas when developing the resist. This limits the selection of the resist materials, which are mostly polymer-based organic materials.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
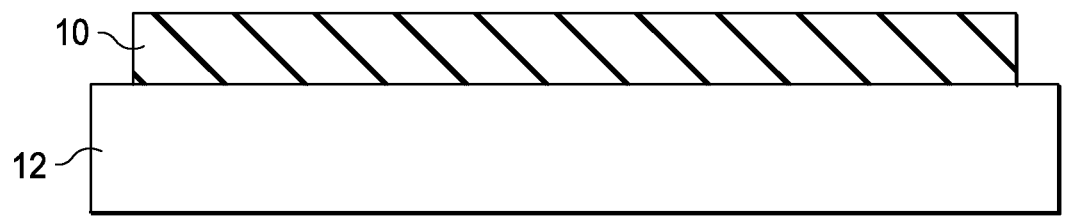
FIGS. 1-4 illustrate a method of forming an integrated circuit using an exposure mask with nano patterning in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The fabrication of an integrated circuit (IC) often involves performing a variety of physical and chemical processes on a semiconductor substrate. In general, the various processes used to make an integrated circuit fall into three categories, namely film deposition, semiconductor doping, and patterning.

In the present disclosure, novel nano patterning techniques are provided. As will be more fully explained below, photons or charged particles are used in combination with a hard mask formed by an atomic layer deposition (ALD) process or a molecular layer deposition (MLD) process to inhibit or prevent an undesirable collapse or deformation of the hard mask when nano gaps are formed therein or nano structures are formed thereon. In addition, the nano patterning techniques disclosed herein eliminate the need for a resist.

Keeping the above-noted basic techniques in mind, novel nano patterning methods used to form an integrated circuit are described in detail below. As will be more fully explained below, patterning particles (e.g., photons or charged particles) may be used to form a gap in a hard mask or, in the alternative, to form a structure upon the hard mask.

In a first embodiment, photons (e.g., deep ultraviolet (DUV) photons, extreme ultraviolet (EUV) photons, or x-ray photons) are used to etch a hard mask. Referring now to FIG. 1, a substrate 12 is provided. In an embodiment, the substrate 12 may be made of a semiconductor material such as silicon, bulk silicon (doped or undoped), germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 12 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. Other substrates that may be used include multi-layered substrates, gradient substrates, or hybrid orientation substrates.

Still referring to FIG. 1, a hard mask 10 is deposited on the substrate 12 using an ALD or MLD process, which offers numerous benefits. For example, ALD and MLD provide extreme thickness resolution, accurate thickness control with one monolayer accuracy, conformal step coverage, and excellent uniformity. In addition, a film thickness can be determined precisely by the number of applied ALD or MLD cycles. Accordingly, a critical dimension (CD) of a gap or trench can be adjusted precisely.

In addition, ALD and MLD allow for high conformality and excellent step coverage on high-aspect-ratio structures. Further, ALD and MLD permit excellent uniformity over a large area, which leads to large-area and large-batch capacity. The ALD and MLD processes also give accurate composition control, low defect density, good reproducibility, and a wider choice of materials (e.g., non-polymer-based) because the exposure mechanism in the conventional photoresist material is not required.

In addition, a hard mask 10 formed using either the ALD process or the MLD process is much harder than, for example, the photoresist used in photolithography processes. Because the hard mask 10 is harder than a photoresist, the hard mask 10 is less likely to undesirably collapse or deform when either gaps are formed therein or structures are formed thereon, as will be more fully explained below.

Other formation processes providing a hard mask 10 having the benefits, properties, and characteristics noted above may also be used.

In an embodiment, the hard mask 10 is prepared by an ALD or an MLD process and formed from $Al_2O_3$, AlN, AlP, AlAs, $Al_xTi_yO_z$, $Al_xCr_yO_z$, $Al_xZr_yO_z$, $Al_xHf_yO_z$, $Al_xSi_yO_z$, $B_2O_3$, BN, $B_xP_yO_z$, $BiO_x$, $Bi_xTi_yO_z$, BaS, $BaTiO_3$, CdS, CdSe, CdTe, CaO, CaS, $CaF_2$, $CuGaS_2$, CoO, $CoO_x$, $Co_3O_4$, $CrO_x$, $CeO_2$, $Cu_2O$, CuO, $Cu_xS$, FeO, $FeO_x$, GaN, GaAs, GaP, $Ga_2O_3$, $GeO_2$, $HfO_2$, $Hf_3N_4$, HgTe, InP, InAs, $In_2O_3$, $In_2S_3$, InN, InSb, $LaAlO_3$, $La_2S_3$, $La_2O_2S$, $La_2O_3$, $La_2CoO_3$, $La_2NiO_3$, $La_2MnO_3$, MgTe, MnTe, MoN, $Mo_2N$, $Mo_xN$, $MoO_2$, MgO, $MnO_x$, MnS, NiO, NbN, $Nb_2O_5$, PbS, $PtO_2$, $PO_x$, $P_xB_yO_z$, RuO, $Sc_2O_3$, $Si_3N_4$, $SiO_2$, SiC, $Si_xTi_yO_z$, $Si_xZr_yO_z$, $Si_xHf_yO_z$, $SnO_2$, $Sb_2O_5$, SrO, $SrCO_3$, $SrTiO_3$, SrS, $SrS_{1-x}Se_x$, $SrF_2$, $Ta_2O_5$, $TaO_xN_y$, $Ta_3N_5$, TaN, $TaN_x$, $Ti_xZr_yO_z$, $TiO_2$, TiN, $Ti_xSi_yN_z$, $Ti_xHf_yO_z$, $VO_x$, $WO_3$, $W_2N$, $W_xN$, $WS_2$, $W_xC$, $Y_2O_3$, $Y_2O_2S$, $ZnS_{1-x}Se_x$, ZnO, ZnS, ZnSe, ZnTe, $ZnF_2$, $ZrO_2$, $Zr_3N_4$, $PrO_x$, $Nd_2O_3$, $Sm_2O_3$, $Eu_2O_3$, $Gd_2O_3$, $Dy_2O_3$, $Ho_2O_3$, $Er_2O_3$, $Tm_2O_3$, $Lu_2O_3$, Ru, Pt, Pd, Rh, Ag, Al, Ir, Cu, Ti, Ta, Mo, W, Ni, Co, Fe, and a mixture therebetween.

Figure 2:
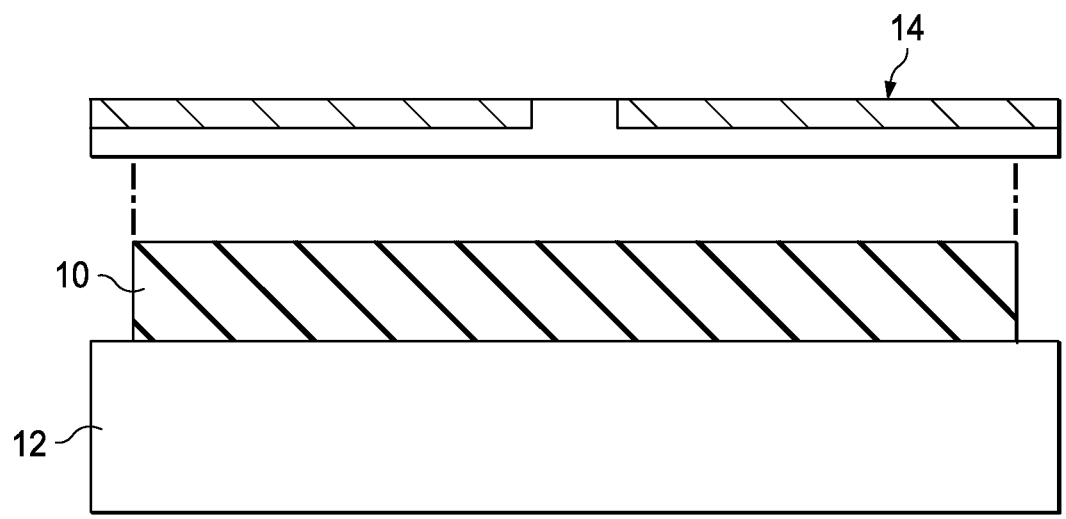

Referring now to FIG. 2, an exposure mask 14 is provided over or on the hard mask 10. In embodiments where EUV photons are used, the medium between the exposure mask 14 and the hard mask 10 may be a vacuum. In embodiments where DUV photons are used, the medium between the exposure mask 14 and the hard mask 10 may be either a vacuum, air, or water. For the DUV photons, air is an acceptable medium due to the longer wavelength of the DUV photos.

The exposure mask 14 may be formed from a variety of different materials with different properties when used with photons. By way of example, for DUV photons (e.g., having a wavelength of about 248 nm or about 193 nm), the exposure mask 14 may be transmissive. Therefore, glass/quartz may be used as a transparent substrate 142 and chrome may be used for a (photon) absorber 144. The photons are able to pass through the areas of the exposure mask 14 formed from the transparent substrate 142 and prevented from passing through the areas of the exposure mask 14 formed from the photon absorber 144. By arranging the areas of transparent substrate 142 relative to the areas of photon absorber 144, a circuit design pattern or layout used in the formation of an integrated circuit may be produced. For example, the pattern may correspond to where metal lines or some other integrated circuit structure will be formed.

For EUV photons (e.g., having a wavelength of about 13.5 nm), the exposure mask 14 may be reflective. Here, glass/quartz may still be used as the transparent substrate 142 for the exposure mask 14. However, instead of using the photon absorber 144, many stacked Mo/Si bilayers are formed on the substrate to provide a (Bragg) reflective surface. By manipulating the manner in which the photons exit the exposure mask 14 using the reflective surface, a circuit design pattern or layout used in the formation of an integrated circuit is produced.

In accordance with some embodiments, the exposure mask 14 may be generated according to a layout design of an integrated circuit. In accordance with some embodiments, the exposure mask 14 may be generated according to a proximity effect model (e.g., well proximity effect model, shallow trench isolation stress proximity model, or other proximity model contemplating the effect that one feature has on another feature located nearby).

Figure 3:
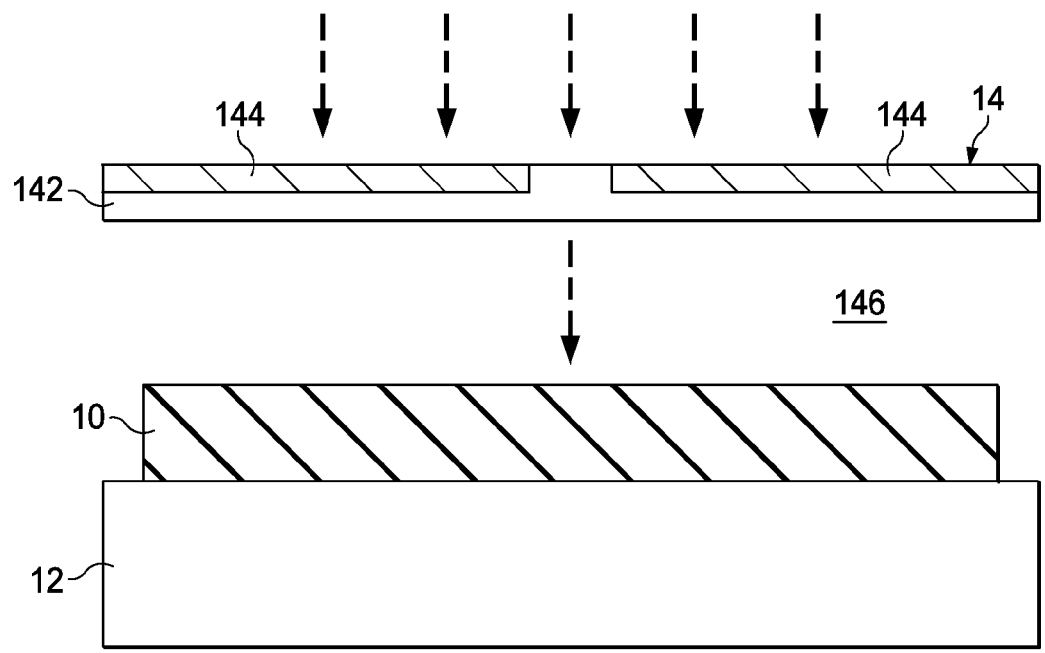

Referring to FIG. 3, a precursor gas 146 is provided. In accordance with some embodiments, the precursor gas 146 is flowed over at least the hard mask 10. In accordance with some embodiments, the precursor gas 146 is, for example, $XeF_2$. Other suitable precursors may also be employed such as $SF_6$, nitrosyl chloride (NOCl), chlorine ($Cl_2$), chlorine trifluoride ($ClF_3$), oxygen ($O_2$), water ($H_2O$), air, and a mixture therebetween. In addition, the exposure mask 14 is exposed to photons (represented by the arrows). In accordance with some embodiments, the area of the exposure mask 14 exposed to the patterning particle (e.g., photons) is greater than about one square millimeter (e.g., 1 mm by 1 mm).

As shown in FIG. 3, the photons are able to pass through the transparent substrate 142 of the exposure mask 14. In the alternative, the photons are able to pass through the exposure mask 14 as dictated by the configuration of a reflective surface, as noted above. In other words, some of the photons are allowed to pass through the exposure mask 14 and reach the underlying hard mask 10 while others are not.

Figure 4:
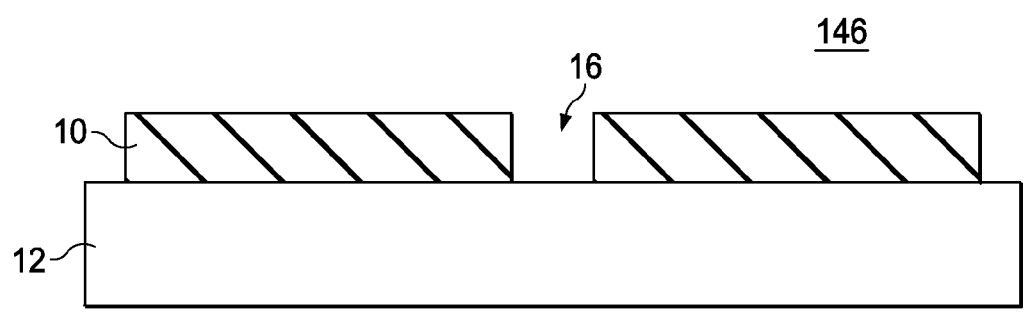

Referring to FIGS. 3-4, the photons that have bypassed the exposure mask 14 encounter molecules from the precursor gas 146 that have absorbed on the hard mask 10. Under the influence of the photon beam, precursor molecules are dissociated into volatile and non-volatile components. The volatile components etch the hard mask 10 only locally at or around the area subjected to the photons to form the gap 16.

In accordance with some embodiments, a depth of the gap 16 is greater than or equal to about fifty percent (50%) of the thickness of the hard mask 10. In an embodiment, the thickness of the hard mask 10 is less than about five nanometers (5 nm). While a single gap 16 is depicted in FIG. 4, it should be recognized that several of the gaps 16 may be formed in practical applications.

Because the hard mask 10 formed by ALD or MLD is harder than a photoresist, the hard mask 10 is less likely to undesirably collapse or deform when the gaps 16 are formed. For example, the hard mask 10 will not undesirably collapse or deform when several of the gaps 16 are formed close to each other, the depth of the gaps 16 is large (e.g., about 10 nm), the width of the gaps 16 is small (e.g., about 1 nm), or the aspect ratio (i.e., the ratio of the depth to width of the gap 16) is high (e.g., about 10 to 1).

After the gap 16 has been formed, other various processes may be performed. For example, a pattern transfer (e.g., etching, deposition/lift off) or implantation may take place during fabrication of the integrated circuit. In accordance with some embodiments, the pattern transfer process is applied using an etching process upon the substrate 12. For example, a wet etch or a plasma etch may be performed to transfer the pattern of the gap 16 into the substrate 12. In accordance with some embodiments, the pattern transfer process incorporates an ion implantation process. For example, impurities (e.g., p-doping with Boron, Indium, etc., or n-doping with Phosphorus, Arsenic, etc.) may be implanted into the substrate 12 through the gap 16.

In a second embodiment, photons are used to sputter (e.g., mill) the hard mask 10 to form the gap 16. In this sputtering embodiment, many of the techniques described above in connection with etching are the same. However, when sputtering the hard mask 10 with photons the precursor gas 146 described above with reference to FIG. 3 is unneeded. Instead of relying on the precursor gas 146, the energy of the photons is used to mill the surface of the hard mask 10 to form the gap 16 shown in FIG. 4.

Figure 5:
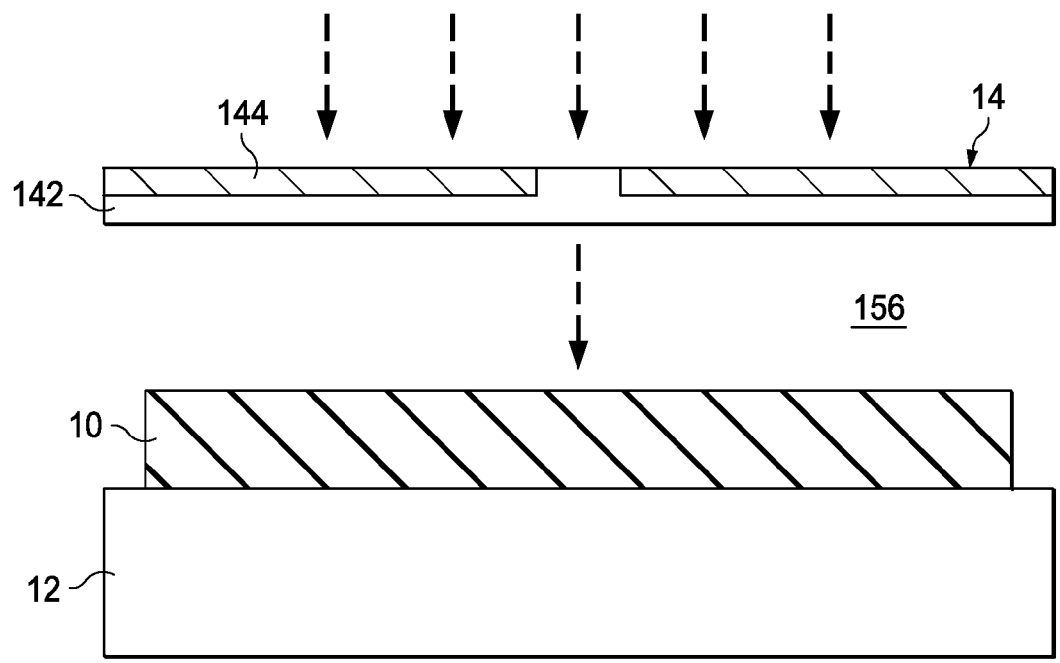
FIGS. 5-6 illustrate another method of forming an integrated circuit using an exposure mask with nano patterning in accordance with some embodiments.
Figure 6:
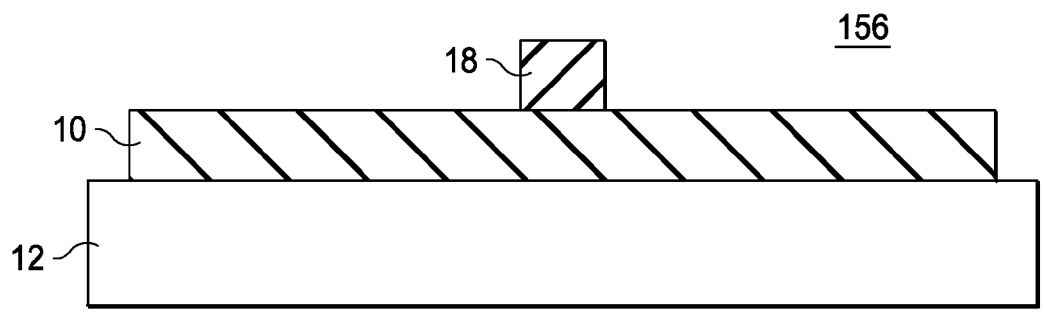

In a third embodiment, photons are used to deposit material on the hard mask 10 to form a structure 18 as shown in FIGS. 5-6. In this deposition embodiment, many of the techniques described above in connection with etching are the same. However, when forming the structure 18 with photons the precursor gas 156 is different than with etching. In accordance with some embodiments, the precursor gas 156 may be TEOS, Styrene, TMCTS, Naphthalene, Al, Au, amorphous carbon, diamond, Co, Cr, Cu, Fe, GaAs, GaN, Ge, Mo, Nb, Ni, Os, Pd, CpPtMe$_3$, MeCpPtMe$_3$, a compound containing Pt, Rh, Ru, Re, Si, Si$_3$N$_4$, SiOx, TiOx, W, and a mixture therebetween to form structure 18.

In the deposition embodiment, the photons are able to pass through the exposed portions of the transparent substrate 142 of the exposure mask 14 as shown in FIG. 5. In the alternative, the photons are able to pass through the exposure mask 14 as dictated by the configuration of the reflective surface, as noted above. In other words, some of the photons are allowed to pass through the exposure mask 14 and reach the underlying hard mask 10 while others are not.

Referring to FIGS. 5-6, the photons that have bypassed the exposure mask 14 encounter molecules from the precursor gas 156 that have absorbed on the hard mask 10. Under the influence of the photon beam, the precursor molecules are dissociated into volatile and non-volatile components. The volatile components adhere to the hard mask 10 only locally at or around the area subjected to the photons to form the structure 18.

Figure 7:
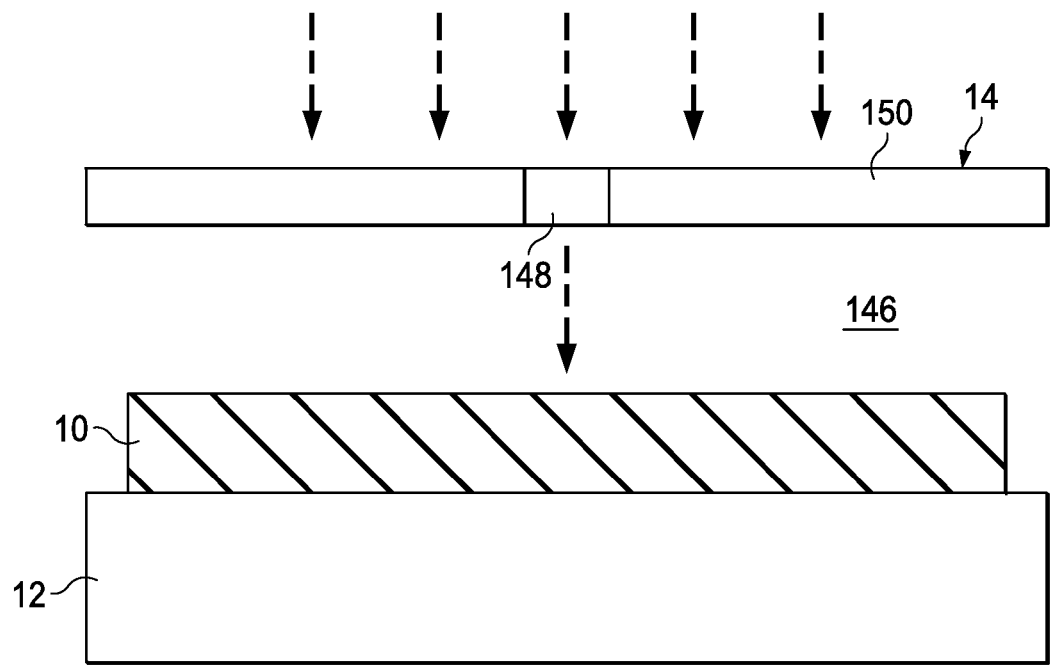
FIGS. 7-8 illustrate another method of forming an integrated circuit using an exposure mask with nano patterning in accordance with some embodiments.
Figure 8:
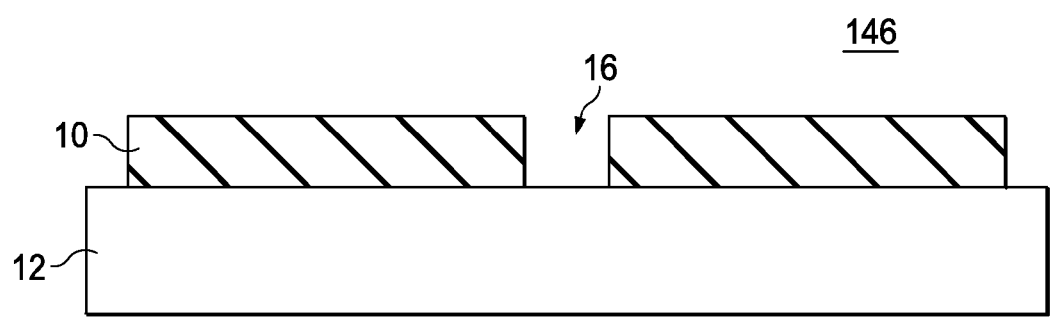

In a fourth embodiment, charged particles are used to etch the hard mask 10 as shown in FIGS. 7-8. In this etching embodiment, many of the techniques described above in connection with etching using photons are the same. However, charged particles are used instead of photons. In accordance with some embodiments, the charged particles may be, for example, an electron, a proton, helium, neon, argon, silicon, beryllium, gold, and gallium. In accordance with some embodiments, one or more of the charged-particle beams has a beam diameter of less than one nanometer (1 nm).

In accordance with some embodiments, the exposure mask 14 used in the etching process is a milling stencil. The milling stencil includes one or more holes 148 that pass through the substrate 150. The charged particles are able to pass through the holes 148, but not the substrate 150 adjacent to the holes 148.

For charged particles, the milling stencil may be formed from an Au or Si$_3$N$_4$ membrane. In addition, the holes 148 or apertures may be formed through the membrane according to the designed circuit layouts. In an embodiment, the exposure area upon the exposure mask 14 is greater than about one square millimeter (e.g., 1 mm by 1 mm).

Referring to FIGS. 7-8, the charged particles that have bypassed the exposure mask 14 encounter molecules from the precursor gas 146 that have absorbed on the hard mask 10. Under the influence of the charged particles, the precursor molecules are dissociated into volatile and non-volatile components. The volatile components etch the hard mask 10 only locally at or around the area subjected to the charged particles to form the gap 16.

In a fifth embodiment, charged particles are used to sputter (e.g., mill) the hard mask 10 to form the gap 16. In this sputtering embodiment, many of the techniques described above in connection with etching using charged particles are the same. However, when sputtering the hard mask 10 with charged particles the precursor gas 146 described above with reference to FIG. 7 is unneeded.

Instead of relying on the precursor gas 146, the energy of the charged particles is used to mill the surface of the hard mask 10 to form the gap 16 shown in FIG. 8.

Figure 9:
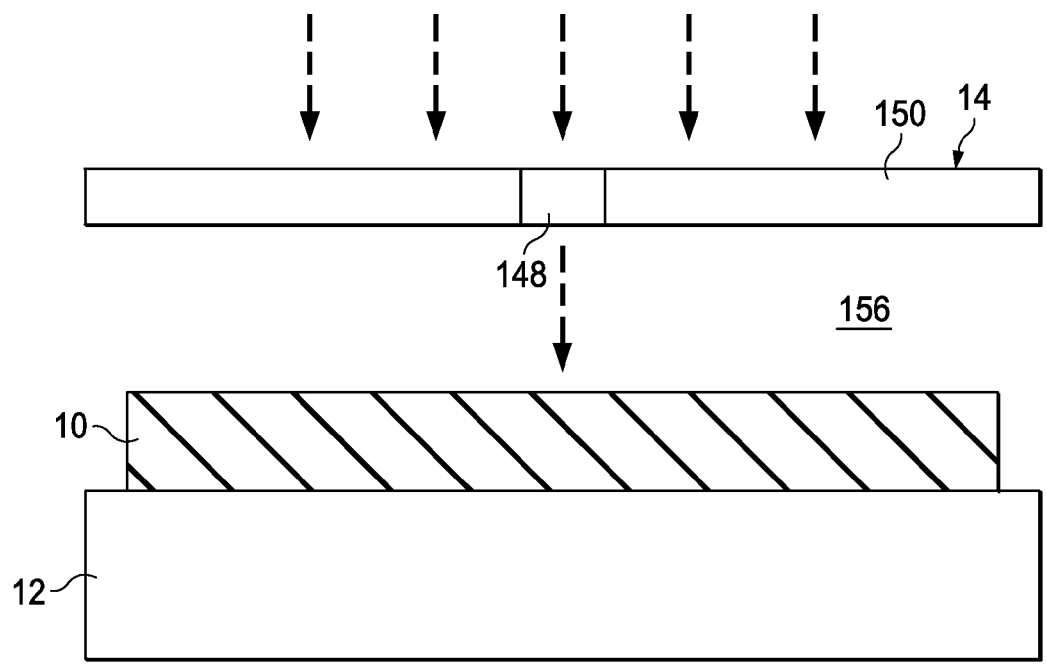
FIGS. 9-10 illustrate another method of forming an integrated circuit using an exposure mask with nano patterning in accordance with some embodiments.
Figure 10:
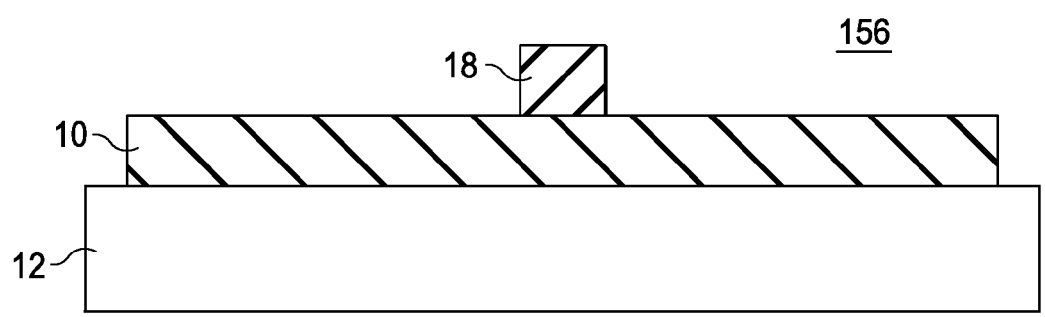

In a sixth embodiment, charged particles are used to deposit material on the hard mask 10 to form the structure 18 as shown in FIGS. 9-10. In this deposition embodiment, many of the techniques described above in connection with etching using charged particles are the same. However, when forming the structure 18 with charged particles the precursor gas 156 is used instead of the precursor gas 146.

The charged particles that have bypassed the exposure mask 14 encounter molecules from the precursor gas 156 that have absorbed on the hard mask 10. Under the influence of the charged particles, the precursor molecules are dissociated into volatile and non-volatile components. The volatile components adhere to the hard mask 10 only locally at or around the area subjected to the charged particles to form the structure 18. In accordance with some embodiments, the structure 18 is a top hard mask formed from, for example, platinum, Pt, Cobalt, Co, silicon dioxide, SiO$_2$.

Figure 11:
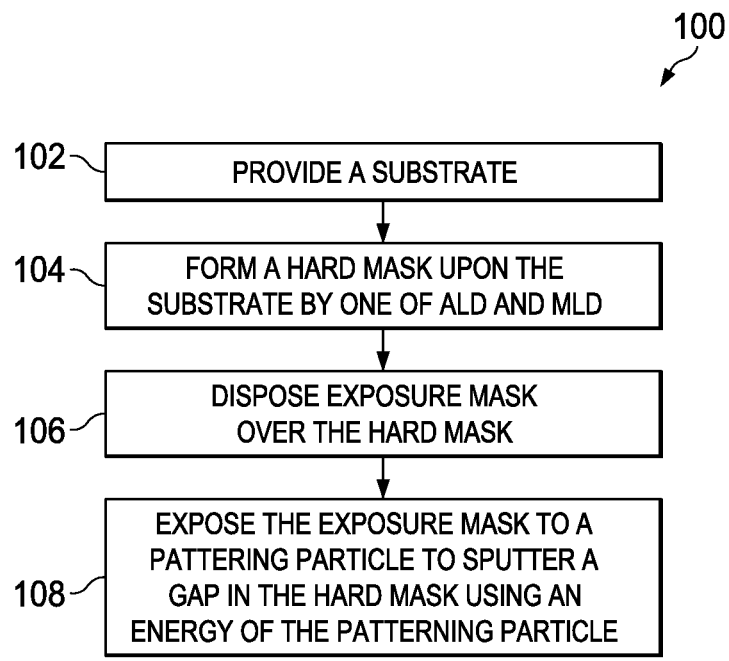
FIG. 11 is a process for fabricating an integrated circuit in accordance with some embodiments.

Referring now to FIG. 11, a process 100 for forming an integrated circuit is provided in accordance with some embodiments. In block 102, a substrate 12 is provided. In block 104, a hard mask 10 is formed on the substrate 12 by one of atomic-layer deposition and molecular-layer deposition. In block 106, an exposure mask 14 is disposed over the hard mask 10. In block 108, the exposure mask 14 is exposed to a patterning particle to sputter a gap 16 in the hard mask 10 using an energy of the patterning particle.

Figure 12:
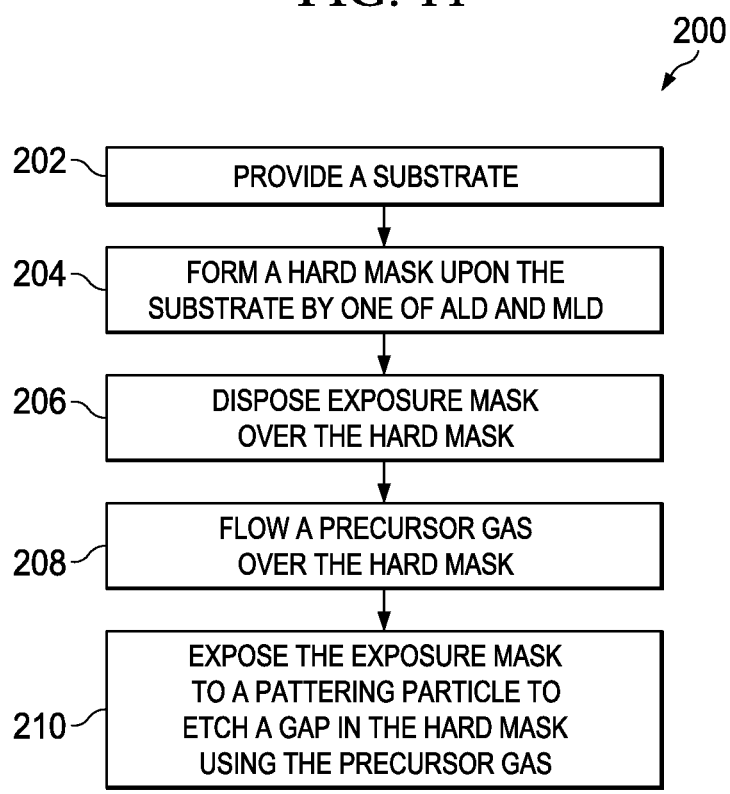
FIG. 12 is a process for fabricating an integrated circuit in accordance with some embodiments.

Referring now to FIG. 12, a process 200 for forming an integrated circuit is provided. In block 202, a substrate 12 is provided. In block 204, a hard mask 10 is formed on the substrate 12 by one of atomic-layer deposition and molecular-layer deposition. In block 206, an exposure mask 14 is disposed over the hard mask 10. In block 208, a precursor gas 146 is flowed over the hard mask 10. In block 210, the exposure mask 14 is exposed to a patterning particle to etch a gap 16 in the hard mask 10 using the precursor gas 146.

Figure 13:
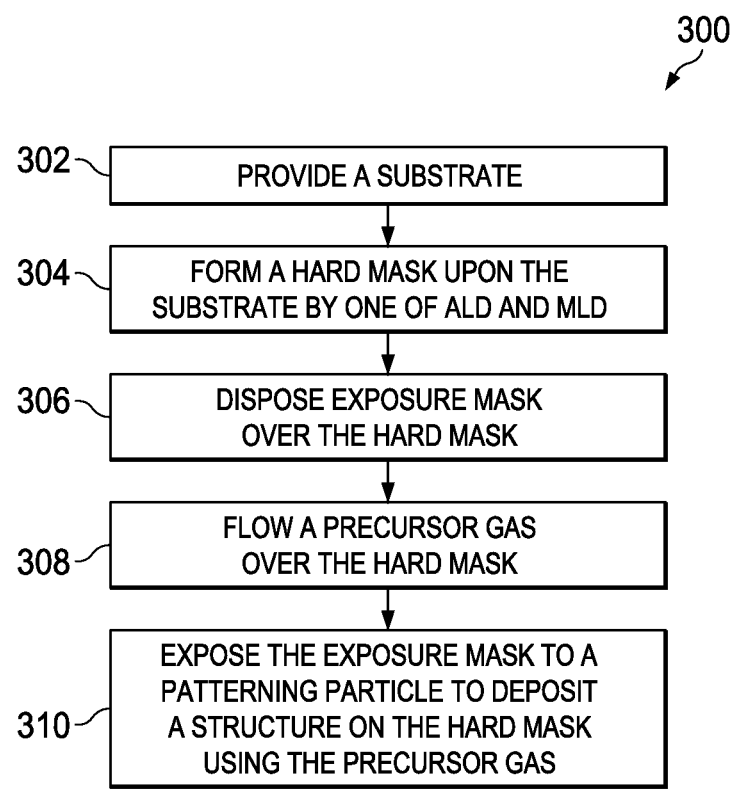
FIG. 13 is a process for fabricating an integrated circuit in accordance with some embodiments.

Referring now to FIG. 13, a process 300 for forming an integrated circuit is provided. In block 302, a substrate 12 is provided. In block 304, a hard mask 10 is formed on the substrate 12 by one of atomic-layer deposition and molecular-layer deposition. In block 306, an exposure mask 14 is disposed over the hard mask 10. In block 308, a precursor gas 156 is flowed over the hard mask 10. In block 310, the exposure mask 14 is exposed to a patterning particle to deposit a structure 18 on the hard mask 10 using the precursor gas 156.

From the foregoing, it should be recognized that the nano patterning methods utilize an exposure mask with (1) charged-particle beam or photon induced etching; (2) charged-particle beam or photon milling; or (3) charged-particle beam or photon-induced deposition along with atomic layer deposition (ALD) or molecular layer deposition (MLD) to eliminate the need for a resist. Because the hard mask 10 formed by ALD or MLD is harder than a photoresist, the hard mask 10 is less likely to undesirably collapse or deform. For example, the hard mask 10 will not undesirably collapse or deform when several of the gaps 16 are formed close to each other, the depth of the gaps 16 is large (e.g., 10 nm), the width of the gaps 16 is small (e.g., 1 nm), or the aspect ratio (i.e., the ratio of the depth to width of the gap 16) is high (e.g., 10 to 1). In addition, the methods may be used to avoid the effects of forward and backward scattering within a resist. Further, with the methods disclosed herein there is no longer a need to develop the resist. As such, resist collapse for patterns with high aspect ratios is no longer an issue.

A process for fabricating an integrated circuit in accordance with some embodiments is provided. The process includes providing a substrate and forming a hard mask on the substrate by one of atomic-layer deposition and molecular-layer deposition. The process also includes disposing an exposure mask over the hard mask and exposing the exposure mask to a patterning particle to pattern a gap in the hard mask.

A process for fabricating an integrated circuit in accordance with some embodiments is provided. The process includes providing a substrate and forming a hard mask on the substrate by one of atomic-layer deposition and molecular-layer deposition. The process also includes patterning the hard mask in accordance with an exposure mask. The patterning exposes a portion of the hard mask to a patterning particle.

A process for fabricating an integrated circuit in accordance with some embodiments is provided. The process includes providing a substrate and forming a hard mask on the substrate by one of atomic-layer deposition and molecular-layer deposition. The process also includes disposing an exposure mask over the hard mask and flowing a precursor gas over an entire surface of the hard mask. The process further includes exposing a portion of the hard mask to a patterning particle in accordance with the exposure mask to pattern the hard mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A process for fabricating an integrated circuit, comprising:
   providing a substrate;
   forming a hard mask on the substrate by one of atomic-layer deposition and molecular-layer deposition;
   disposing an exposure mask over the hard mask; and
   exposing the exposure mask to a patterning particle to pattern a gap in the hard mask, the exposing removing at least a portion of the hard mask.

2. The process of claim 1, wherein the gap in the hard mask is patterned by sputtering and using an energy of the patterning particle.

3. The process of claim 1, wherein the gap in the hard mask is patterned by etching with a precursor.

4. The process of claim 1, wherein the patterning particle is a photon.

5. The process of claim 1, wherein the patterning particle is one of a deep ultraviolet photon, an extreme ultraviolet photon, and an x-ray photon.

6. The process of claim 1, wherein the patterning particle is a charged particle.

7. The process of claim 1, wherein the patterning particle is one of helium, neon, argon, silicon, beryllium, gold, and gallium.

8. The process of claim 1, wherein a thickness of the hard mask is less than about five nanometers.

9. A process for fabricating an integrated circuit, comprising:
   providing a substrate;
   forming a hard mask on the substrate by one of atomic-layer deposition and molecular-layer deposition; and
   patterning the hard mask in accordance with an exposure mask, the patterning exposing a portion of the hard mask to a patterning particle.

10. The process of claim 9, wherein the patterning particle is one of a deep ultraviolet photon, an extreme ultraviolet photon, and an x-ray photon.

11. The process of claim 9, wherein the patterning particle is one of helium, neon, argon, and gallium.

12. The process of claim 9, wherein the patterning particle forms a gap in the hard mask by sputtering.

13. The process of claim 9, wherein the patterning particle forms a gap in the hard mask by etching with a precursor gas, the precursor gas comprising one of $XeF_2$, $SF_6$, nitrosyl chloride (NOCl), chlorine ($Cl_2$), chlorine trifluoride ($ClF_3$), oxygen ($O_2$), water ($H_2O$), air, and a combination thereof.

14. The process of claim 9, wherein a medium between the exposure mask and the hard mask is a vacuum, air, or water.

15. A process for fabricating an integrated circuit, comprising:
   providing a substrate;
   forming a hard mask on the substrate by one of atomic-layer deposition and molecular-layer deposition;
   disposing an exposure mask over the hard mask;
   flowing a precursor gas over an entire surface of the hard mask; and
   exposing a portion of the hard mask to a patterning particle in accordance with the exposure mask to pattern the hard mask, wherein the patterning particle and the precursor gas form a structure on the hard mask.

16. The process of claim 15, wherein the patterning particle is one of a deep ultraviolet photon, an extreme ultraviolet photon, and an x-ray photon.

17. The process of claim 15, wherein the patterning particle is one of helium, neon, argon, and gallium.

18. The process of claim 15, wherein the precursor gas contains one of TEOS, Styrene, TMCTS, Naphthalene, Al, Au, amorphous carbon, diamond, Co, Cr, Cu, Fe, GaAs, GaN, Ge, Mo, Nb, Ni, Os, Pd, $CpPtMe_3$, $MeCpPtMe_3$, a compound containing Pt, Rh, Ru, Re, Si, $Si_3N_4$, SiOx, TiOx, W, and a combination thereof.

19. The process of claim 15, wherein the exposure mask has a plurality of apertures extending therethrough.

20. The process of claim 19, wherein the structure is disposed on the hard mask below one of the plurality of apertures.

* * * * *